United States Patent [19]
Jiang et al.

[11] Patent Number: 6,061,380
[45] Date of Patent: May 9, 2000

[54] VERTICAL CAVITY SURFACE EMITTING LASER WITH DOPED ACTIVE REGION AND METHOD OF FABRICATION

[75] Inventors: Wenbin Jiang, Phoenix; Michael S. Lebby, Apache Junction; Jamal Ramdani, Gilbert, all of Ariz.

[73] Assignee: Motorola, Inc., Schaumburg, Ill.

[21] Appl. No.: 08/929,515

[22] Filed: Sep. 15, 1997

[51] Int. Cl.[7] .............................. H01S 3/08; H01S 3/085
[52] U.S. Cl. .............................. 372/96; 372/45; 372/43; 372/28; 257/184; 257/201
[58] Field of Search .................... 372/96, 45, 43, 372/28, 48, 68; 257/184, 201

[56] References Cited

U.S. PATENT DOCUMENTS

| | | | |
|---|---|---|---|
| 4,881,238 | 11/1989 | Chinone et al. | 372/68 |
| 5,317,587 | 5/1994 | Ackley et al. | 372/45 |
| 5,319,657 | 6/1994 | Otsuka et al. | 372/43 |
| 5,519,721 | 5/1996 | Takano | 372/48 |
| 5,557,626 | 9/1996 | Grodzinski et al. | 372/45 |
| 5,574,738 | 11/1996 | Morgan | 372/28 |
| 5,737,353 | 4/1998 | Sasaki | 372/45 |

*Primary Examiner*—Hemang Sanghavi
*Assistant Examiner*—Sung T. Kim
*Attorney, Agent, or Firm*—Eugene A. Parson; William E. Koch

[57] ABSTRACT

VCSEL for high speed operation and method of fabrication including a substrate element, a first stack of distributed Bragg reflectors disposed on a surface of the substrate element, an active region lattice matched to a surface of the first stack of distributed Bragg reflectors, and a second stack of distributed Bragg reflectors lattice matched to a surface of the active region. The active region includes a plurality of quantum well layers, or structures, and a plurality of doped barrier layers. The doping of the barrier layers allows for a faster recombination time of the carriers prior to any occurrence of lateral carrier diffusion. This faster recombination time of the carriers prevents turn-off tails when the VCSEL device is switched off.

27 Claims, 2 Drawing Sheets

VERTICAL CAVITY SURFACE EMITTING LASER WITH DOPED ACTIVE REGION AND METHOD OF FABRICATION

FIELD OF THE INVENTION

This invention relates to vertical cavity surface emitting lasers and more specifically to vertical cavity surface emitting lasers for high speed operation.

BACKGROUND OF THE INVENTION

Recently, there has been interest in a new type of light emitting device called a vertical cavity surface emitting laser (VCSEL). Conventional VCSELs have several potential advantages, such as a planar construction, emitting light perpendicular to the surface of the die, and the possibility of array fabrication.

Typically, VCSELs include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an $Al_{x1}Ga_{1-x1}As \backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. In conventional devices, the number of mirror pairs per stack may range from 20–40 pairs to achieve a high percentage of reflectivity, depending on the difference between the refractive indices of the layers. The large number of pairs increases the percentage of reflected light.

In conventional VCSELs, conventional material systems perform adequately. However, new products are being developed, such as light sources for gigabit/sec ethernet and fiber channel applications, that require VCSELs to operate at a higher speed. Accordingly, there exists several problems related with the conventional VCSELs operating at such high speed, such as the limitation of the VCSEL speed due to lateral carrier diffusion when modulated at GHz frequency, of which such carrier diffusion causes long optical decay tails following the switch-off of the driving source.

These problems are generally caused by the way the carrier is injected into the active area. In that the carrier distribution area is larger than the optical mode area, the carriers outside of the optical mode region in the active area will backfill the area overlapped with the optical mode, thereby causing optical tailing effects when the driving current is switched off.

It can readily be seen that conventional VCSELs and the conventional methods of fabricating them will not be able to achieve performance levels in terms of high speed operation, and the like required for today's marketplace. Thus, there is a need for developing a reliable, stable and cost effective vertical cavity surface emitting laser (VCSEL) for use in high speed operations, that includes a shorter carrier lifetime so as to reduce device turn-off tails, thus allowing operation of the device at higher speeds.

It would be highly advantageous, therefore, to remedy the foregoing and other deficiencies inherent in the prior art. Accordingly, it is an object of the present invention to provide a new and improved VCSEL for use in high speed operations.

Another object of the invention is to provide a reliable high speed VCSEL.

And another object of the immediate invention is to provide for a shorter carrier lifetime in a high speed VCSEL, thereby reducing device turn-off tails.

Yet another object of the invention is to provide for a highly manufacturable high speed VCSEL.

SUMMARY OF THE INVENTION

Briefly, to achieve the desired objects of the instant invention in accordance with a preferred embodiment thereof, provided is a VCSEL for use in high speed applications. The VCSEL generally includes a substrate, a first stack of distributed Bragg reflectors, an active region, and a second stack of distributed Bragg reflectors. In a preferred embodiment, the active region includes multiple quantum wells structures, including barrier layers. The barrier layers are lightly doped with either a p-type or n-type dopant thereby shortening the carrier lifetime and eliminating the lateral carrier diffusion. This will allow for high speed operation without device turn-off tails due to lateral carrier diffusion when the device is switched off.

BRIEF DESCRIPTION OF THE DRAWING

The foregoing and further and more specific objects and advantages of the instant invention will become readily apparent to those skilled in the art from the following detailed description of a preferred embodiment thereof taken in conjunction with the drawing, in which.

DETAILED DESCRIPTION OF THE DRAWING

Figure 1:
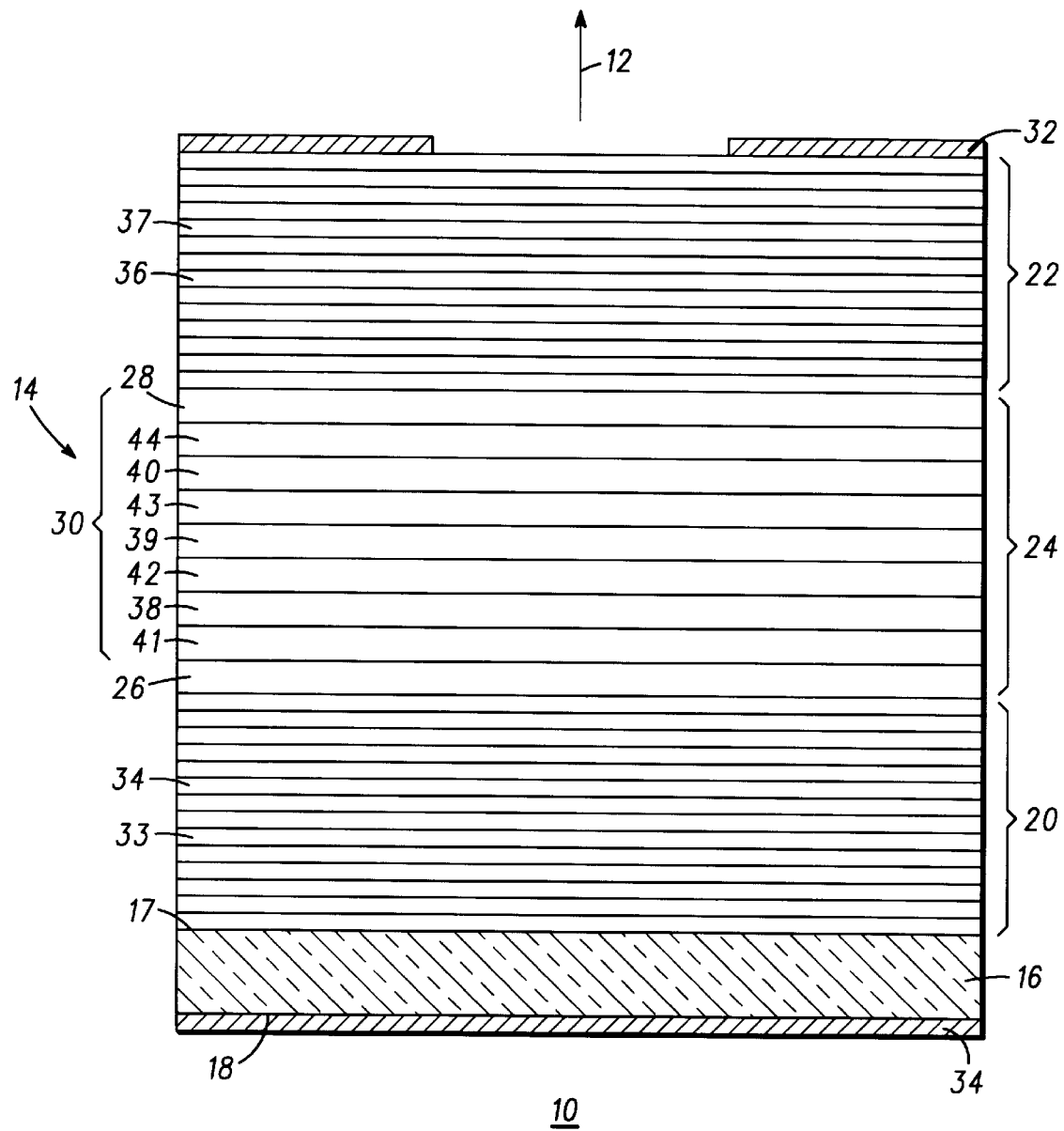
FIG. 1 is a sectional view of a VCSEL structure in accordance with the present invention.

FIG. 1 is a greatly enlarged simplified sectional view of a vertical cavity surface emitting laser (VCSEL) 10 with light 12 being emitted therefrom. VCSEL 10 is defined by a wafer structure 14, which in this particular embodiment is formed as a planar wafer structure. As shown in FIG. 1, VCSEL 10 is made of several main elements or features, such as a substrate 16 having surfaces 17 and 18, stacks 20 and 22 of distributed Bragg reflectors, active region 24, including cladding regions 26 and 28, and active area 30, and contact regions 32 and 34. Stacks 20 and 22 of distributed Bragg reflectors each include a plurality of alternating layers illustrated by layers 33 and 34, and layers 36 and 37, respectively. Active area 30 includes a plurality of quantum well layers 38, 39 and 40 and barrier layers 41, 42, 43, and 44 with quantum well layers 38, 39 and 40 being alternately positioned between barrier layers 41, 42, 43, and 44

Wafer structure 14 is formed on a substrate 16, which in this specific embodiment is gallium arsenide (GaAs). GaAs is preferably used to facilitate lattice matching of the components of wafer structure 14 which in this particular embodiment emits infrared wavelength light, more particularly light in a range of 770 nm to 880 nm, dependent upon the specific material system used. A GaAs substrate is utilized so as to facilitate epitaxial growth of subsequent multiple layers that compose wafer structure 14, thus device 10. It should be understood that GaAs is only utilized as an example and other semiconductor materials may be employed as substrate 16, such as silicon (Si), indium phosphide (InP), or the like. Additionally, dependent upon material system, any wavelength emission is achievable by the structure disclosed in the present invention.

Typically, any suitable epitaxial deposition method, such as molecular beam epitaxy (MBE), metal organic chemical vapor deposition (MOCVD), or the like is used to make the required multiple layers for wafer structure 14. These methods allow for the epitaxial deposition of material layers, such as aluminum gallium arsenide, aluminum arsenide, indium aluminum gallium phosphide, gallium arsenide, and aluminum arsenide, or aluminum gallium phosphide, indium aluminum phosphide, and the like. It should be understood that epitaxial deposition is used extensively to produce the multitude of layers that comprise complete VCSEL device 10 of the present invention.

Substrate 16 has an upper surface 17 and a lower surface 18. There is disposed on upper surface 17, first stack 20 of distributed Bragg reflectors. Active region 24 is disposed on stack 20 of distributed Bragg reflectors. Active region 24 includes active structure 30 sandwiched between first cladding region 26 adjacent first stack 20 of distributed Bragg reflectors and second cladding region 28. Second stack 22 of distributed Bragg reflectors is disposed on second cladding region 28.

Referring now to stacks 20 and 22 of distributed Bragg reflectors, it should be understood that first stack 20 of distributed Bragg reflectors is deposited first with subsequent deposition defining cladding region 26, active structure 30, cladding region 28, and second stack 22 of distributed Bragg reflectors. First and second stacks 20 and 22 of distributed Bragg reflectors are each composed of a plurality of layers, 33 and 34, and 36 and 37, respectively. Generally, thicknesses of alternating layers 33, 34, 36, and 37 are typically set as portions of a wavelength of light (not shown) that the complete VCSEL device 10 is designed to emit. Thus, specific thicknesses of the alternating layers 33, 34, 36, and 37 are a function of the designed wavelength at which VCSEL 10 is to operate. Typically, the most common wavelength values used are one-quarter, one-half, three-quarters, full wavelength, or any multiples thereof. In a preferred embodiment of the present invention, one-quarter wavelength thicknesses are used.

Generally, doping of stacks 20 and 22 of distributed Bragg reflectors is split with one of the stacks of distributed Bragg reflectors being N-type and the other being P-type. Since doping levels are well known in the art, the doping levels will not be described herein other than to identify material either as undoped, P-typed doped such as with carbon, zinc or the like, or N-typed doped such as with selenium, silicon, or the like. Briefly, in this particular embodiment, stack 20 of distributed Bragg reflectors and a portion of cladding region 26 are N-type doped, with a portion of cladding region 26, active structure 30, and a portion of cladding region 28 being undoped, and with a portion of cladding region 28, and second stack 22 of distributed Bragg reflectors being P-type doped.

In the present invention, distributed first and second stacks 20 and 22 of distributed Bragg reflectors, having alternating layers 33, 34, 36, and 37, are made of any suitable materials, such as aluminum gallium arsenide (AlGaAs) with the aluminum percentage ranging from 0 to 100% or materials forming a mirror stack. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. The number of mirror pairs per stack may range from 20–40 pairs to achieve a high percentage of reflectivity, depending on the difference between the refractive indices of the layers. In the embodiments disclosed in the present invention it is anticipated that second stack 22 of distributed Bragg reflectors can alternatively include a plurality of pairs of alternating layers of a dielectric material to be deposited as a final step in the device fabrication process.

More specifically, a VCSEL structure designed to emit at 780 nm will include alternating layers 33, 34, 36, and 37 of $Al_{0.25}Ga_{0.75}As/Al_{0.95}Ga_{0.05}As$ or $Al_{0.25}Ga_{0.75}As/AlAs$. A VCSEL structure designed to emit at 850 nm will include alternating layers 33, 34, 36, and 37 of $Al_{0.15}Ga_{0.85}As/Al_{0.85}Ga_{0.15}As$. Irrespective of the material system utilized, layers 33 and 34 are epitaxially disposed or deposited on or overlaying substrate 16 and layers 36 and 37 are epitaxially disposed or deposited on or overlaying cladding region 28, thereby generating stacks 20 and 22 of distributed Bragg reflectors, respectively. It should be understood that while AlGaAs/AlAs DBR structures are utilized in the preferred embodiment, alternative DBR structures utilizing materials such as indium aluminum gallium phosphide and aluminum arsenide (e.g., $In_{0.49}Al_xGa_{0.51-x}P/AlAs$), and indium aluminum gallium phosphide and indium aluminum phosphide (e.g., $In_{0.49}Al_xGa_{0.51-x}P/In_{0.49}Al_{0.51}P$) are anticipated by this disclosure for the device to operate at a red visible emission wavelength (635–700 nm) in association with an appropriate active medium. Additionally, it should be understood that in each of the above examples and throughout this disclosure where a percent composition of a particular element is given it should be considered only as an example. It should be further understood that variations from these examples can be large and are to be considered part of the present invention.

Stacks 20 and 22 of distributed Bragg reflectors are formed by depositing pairs of alternating layers using some convenient technique such as molecular beam epitaxy (MBE) or sputtering. In order to crystal lattice match stack 20 to substrate 16 a suitable semiconductor material system must be deposited. Approximately 20–40 mirror pairs of this material system are deposited on substrate 16 depending on the difference between the refractive indices of the layers. As will be explained presently, substrate doping is not necessary since electrical contacts to active region 24 can be made laterally to doped stack 20 of distributed Bragg reflectors.

For the sake of simplicity and to prevent overcrowding of the figure, cladding regions 26 and 28 are each shown as single layers; however, it should be understood that doping of cladding regions 26 and 28 is dependent upon whether cladding regions 26 and 28 are each made of a single layer or a plurality of layers. If cladding regions 26 and 28 are each made of a single layer, then cladding regions 26 and 28 are not doped. If cladding regions 26 and 28 include a plurality of layers, then at least a portion of the plurality of layers of cladding regions 26 and 28 are doped. With cladding regions 26 and 28 being made of a plurality of layers, the doping of the portion to be doped is consistent to its adjacent transition regions and its adjacent stack of distributed Bragg reflectors. In this particular embodiment cladding regions 26 and 28 are made of at least two components.

Multi-layer cladding region 26 is epitaxially disposed or deposited on stack 20 of distributed Bragg reflectors. First, a layer of any suitable material such as aluminum gallium arsenide (AlGaAs) having an appropriate thickness and being doped similarly to stack 20 of distributed Bragg reflectors is epitaxially deposited on stack 20 of distributed Bragg reflectors.

By way of example, a N-doped aluminum gallium arsenide layer ($Al_{0.60}Ga_{0.40}As$) is epitaxially deposited on stack 20 of distributed Bragg reflectors. Generally, the AlGaAs layer has a thickness that is determined by the wavelength of light that is to be emitted from the VCSEL structure, thereby allowing the thickness of the AlGaAs layer to be any suitable thickness. Second, a layer of any suitable material such as aluminum gallium arsenide (AlGaAs) having an appropriate thickness is epitaxially deposited on the first layer of the cladding region 26.

Active structure 30 is represented by a plurality of layers which are epitaxially deposited or disposed on cladding region 26. It should be understood that active structure 30 includes multiple barrier layers 41, 42, 43 and 44 with quantum well layers 38, 39 and 40 interspersed therebetween. By way of a simple example, active structure 30 includes at least four barrier layers 41, 42, 43, and 44 and at least three quantum well layers 38, 39, and 40 with the quantum well layers being positioned between the barrier layers. In a VCSEL structure that emits at 780 nm, the quantum well layer(s) are made of undoped aluminum gallium arsenide ($Al_{0.12}Ga_{0.88}As$) and the barrier layers are made of a lightly doped aluminum gallium arsenide ($Al_{0.30}Ga_{0.70}As$). In a VCSEL structure that emits at 850 nm, the quantum well layer(s) are made of undoped gallium arsenide (GaAs) and the barrier layers are made of a lightly doped aluminum gallium arsenide ($Al_{0.30}Ga_{0.70}As$). Typically, active structure 30 includes three to five quantum well layers with their corresponding barrier layers. One skilled in the art will understand that more or fewer quantum well layers and barrier layers can be used depending upon the application. Active region 24 and first and second stacks 20 and 22 of distributed Bragg reflectors respectively are configured to emit light with a wavelength of approximately 780 nm or 850 nm.

As stated, barrier layers 41, 42, 43 and 44 are made of a lightly doped aluminum gallium arsenide material. The doping of barrier layers 41, 42, 43 and 44 creates some level of non-radiative recombination centers in the active structure 30 which serves to shorten the carrier lifetime, thus the time for recombination. This shortening of the carrier recombination time allows for the recombination of the carriers before they can be diffused, thus eliminating lateral carrier diffusion. In other words, the carrier recombination time becomes shorter than the carrier diffusion time. This decrease in carrier recombination time provides for a reduction in the turn-off tails when the device is switched off.

However, doping causes free carrier absorption which decreases the gain. To limit the gain loss, the doping will only be applied in barrier layers 41, 42, 43, and 44 of the active structure 30. The doping material of barrier layers 41, 42, 43 and 44 should be stable and inert. Suitable p-type dopants include carbon (C) or the like, and suitable n-type dopants include selenium (Se) and silicon (Si), or the like. It should be understood that there is no doping in quantum well layers 38, 39 and 40, so that there is no degradation in the total gain other than the shortening of the carrier recombination lifetime due to increased traps in barrier layers 41, 42, 43 and 44. The level of doping of barrier layers 41, 42, 43 and 44 should be to a concentration ranging from $5 \times 10^{15}$ to $5 \times 10^{17}$ cm$^{-3}$, with a preferred range from $1 \times 10^{16}$ to $1 \times 10^{17}$ cm$^{-3}$, with a nominal range from $1 \times 10^{16}$ to $5 \times 10^{16}$ cm$^{-3}$.

For the sake of simplicity and to prevent overcrowding of the figure, cladding region 28 is shown as a single layer; however, as previously stated, it should be understood that cladding region 28 is made of multiple layers that are disposed or deposited epitaxially on active structure 30. First, a layer of any suitable undoped cladding material is epitaxially deposited to an appropriate thickness on active structure 30. Second, a layer of any suitable doped cladding material is epitaxially deposed on the undoped cladding material.

By way of example, an undoped aluminum gallium arsenide ($Al_{0.30}Ga_{0.70}As$) layer is epitaxially deposited on active structure 30. Generally, the undoped AlGaAs has a thickness that is determined by the wavelength of light that is to be emitted from the VCSEL device, thereby allowing the thickness of the AlGaAs layer to be any suitable thickness. Subsequently, a doped aluminum gallium arsenide ($Al_{0.60}Ga_{0.40}As$) layer is epitaxially deposited on the undoped layer. The doped layer is generally doped with a P-type dopant.

Figure 2:
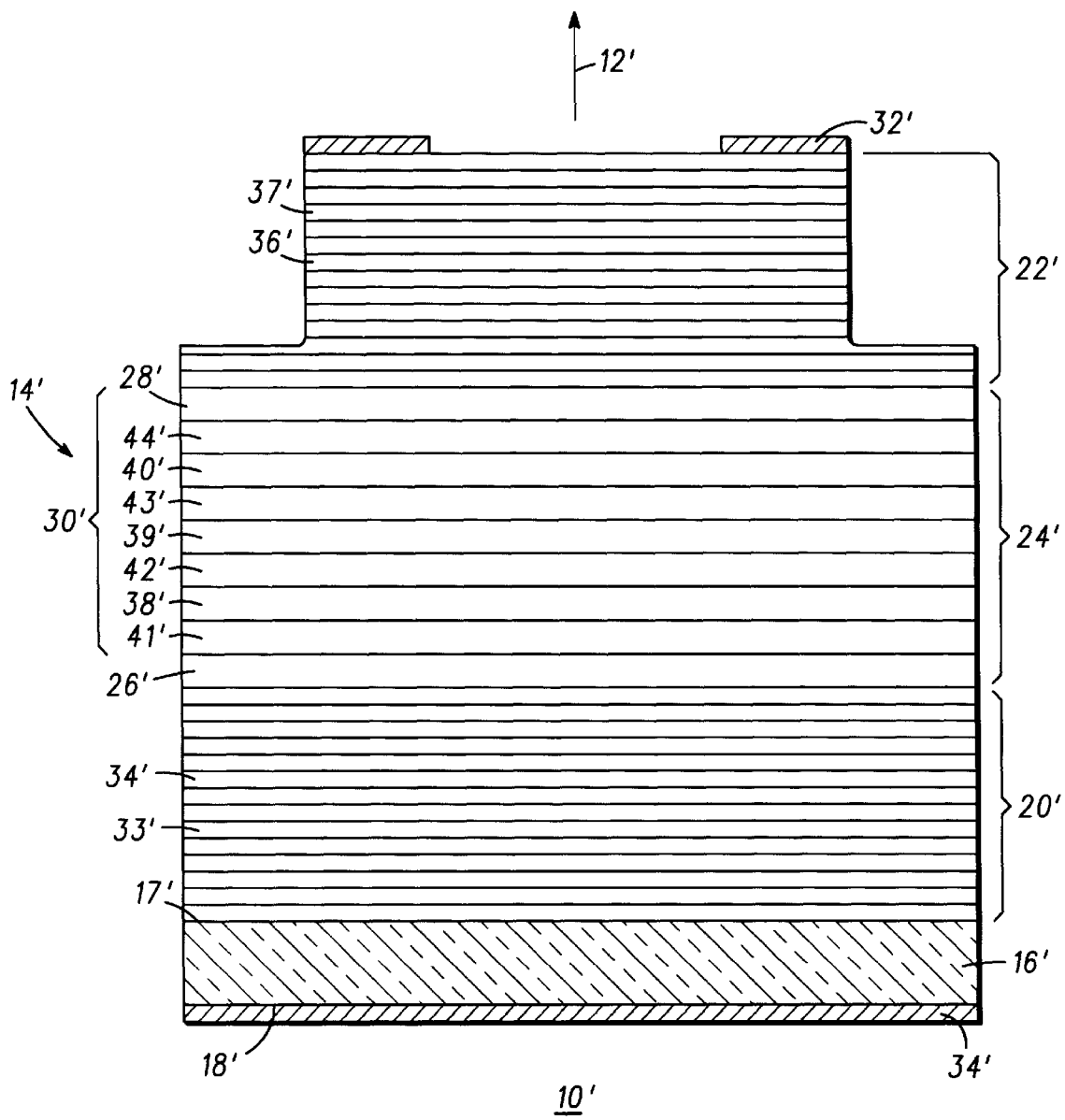
FIG. 2 is a sectional view of a ridge VCSEL structure in accordance with the present invention.

If desired, once the material layers have been fabricated on substrate 16, the material layers can be patterned by any suitable method or combination of methods, such as photolithography, etching, deposition, or the like, to form a ridge VCSEL as illustrated in FIG. 2. For example, a dot pattern can be formed by a photolithography process on the material layers where portions of the material layers are exposed and where portions of the material layers are covered by the dot pattern. The dot pattern is then etched by any suitable technique such as dry etching or wet etching where the portions that are exposed are removed while the covered portions are not removed, thereby forming a ridge structure. As illustrated in FIG. 2, disclosed is another embodiment of a VCSEL structure generally designated 10' when fabricated as a ridge VCSEL. It should be understood that with regards to FIGS. 1 and 2, similar elements are designated with similar numbers having a prime added to indicate a different embodiment. A complete discussion of elements previously described is omitted for purposes of simplicity.

To complete wafer structure 14, more particularly device, 10, an electrical contact 34 is coupled to a surface 18 of substrate 16. A second electrical contact 32 is coupled to distributed Bragg reflector 22. Light 12 is emitted from device 10 in a direction opposite substrate 16. Various changes and modifications to the embodiments herein chosen for purposes of illustration will readily occur to those skilled in the art. For example, it should be understood that VCSEL structure symmetry exists for both the p and n dopants as well as electrically inverted structure designs.

By now it should be appreciated that a novel article and method for making the article have been provided. A vertical cavity surface emitting laser is disclosed having improved performance in terms of carrier recombination so as to prevent lateral carrier diffusion, thus turn-off tails when the device is switched off. The device is capable of high speed operation in excess of 1 gigahertz or 1 gigabit/sec.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser device comprising:
    a substrate having a surface;
    a first stack of distributed Bragg reflectors disposed on the surface of the substrate;
    an active region disposed on the first stack of distributed Bragg reflectors, the active region including a plurality of quantum well layers and a plurality of uniformly doped barrier layers wherein the plurality of uniformly doped barrier layers provide for the shortening of carrier lifetime and the elimination of lateral carrier diffusion; and
    a second stack of distributed Bragg reflectors disposed on the active region.

2. A vertical cavity surface emitting laser device as claimed in claim 1 wherein the laser is configured for high speed operation of greater than 1 gigahertz.

3. A vertical cavity surface emitting laser device as claimed in claim 2 wherein the laser is defined by a planar wafer structure.

4. A vertical cavity surface emitting laser device as claimed in claim 2 wherein the laser is defined by a ridge wafer structure.

5. A vertical cavity surface emitting laser device as claimed in claim 2 wherein the active region and the first and the second stacks of distributed Bragg reflectors are configured to emit light with a wavelength in a range of approximately 770 nm to 880 nm.

6. A vertical cavity surface emitting laser device as claimed in claim 2 wherein the plurality of doped barrier layers are doped with a n-type dopant.

7. A vertical cavity surface emitting laser device as claimed in claim 6 wherein the n-type dopant includes one of silicon (Si) and selenium (Se).

8. A vertical cavity surface emitting laser device as claimed in claim 2 wherein the plurality of doped barrier layers are doped with a p-type dopant.

9. A vertical cavity surface emitting laser device as claimed in claim 8 wherein the p-type dopant includes one of carbon (C) and zinc (Zn).

10. A vertical cavity surface emitting laser device as claimed in claim 2 wherein the first stack of distributed Bragg reflectors and the second stack of distributed Bragg reflectors each include a plurality of pairs of alternating layers of an $Al_{x1}Ga_{1-x1}As/Al_{x2}Ga_{1-x2}As$ material system.

11. A vertical cavity surface emitting laser device as claimed in claim 10 where x1 ranges from 0 to 50% and x2 ranges from 50 to 100%.

12. A vertical cavity surface emitting laser device as claimed in claim 2 wherein the first stack of distributed Bragg reflectors includes a plurality of pairs of alternating layers of a $Al_{x1}Ga_{1x-1}As/Al_{x2}Ga_{1-x2}As$ material and the second stack of distributed Bragg reflectors includes a plurality of pairs of alternating layers of a dielectric material.

13. A vertical cavity surface emitting laser device as claimed in claim 12 where x1 ranges from 0 to 50% and x2 ranges from 50 to 100%.

14. A vertical cavity surface emitting laser device comprising:
    a substrate having a surface;
    a first stack of distributed Bragg reflectors including a plurality of pairs of alternating layers disposed on the surface of the substrate, the first stack of distributed Bragg reflectors having a surface;
    an active region having a first and a second surface and including an active structure sandwiched between a first cladding region and a second cladding region, the active structure including multiple undoped quantum well structures and a plurality of uniformly doped barrier layers, wherein the plurality of uniformly doped barrier layers provide for the shortening of carrier lifetime and the elimination of lateral carrier diffusion, the active region being lattice matched to the surface of the first stack of distributed Bragg reflectors; and
    a second stack of distributed Bragg reflectors lattice matched to the second surface of the active region and including a plurality of pairs of alternating layers.

15. A vertical cavity surface emitting laser device as claimed in claim 14 wherein the laser is configured for high single mode operation of greater than 1 gigabit/sec.

16. A vertical cavity surface emitting laser device as claimed in claim 14 wherein the active region and the first and the second stacks of distributed Bragg reflectors are configured to emit light with a wavelength of approximately 780 nm.

17. A vertical cavity surface emitting laser device as claimed in claim 14 wherein the active region and the first and the second stacks of distributed Bragg reflectors are configured to emit light with a wavelength of approximately 850 nm.

18. A vertical cavity surface emitting laser device as claimed in claim 14 wherein plurality of doped barrier layers are doped with a n-type dopant.

19. A vertical cavity surface emitting laser device as claimed in claim 18 wherein the n-type dopant includes one of selenium (Se) and silicon (Si).

20. A vertical cavity surface emitting laser device as claimed in claim 14 wherein the plurality of doped barrier layers are doped with a p-type dopant.

21. A vertical cavity surface emitting laser device as claimed in claim 20 wherein the p-type dopant includes one of copper (C) and zinc (Zn).

22. A method of fabricating a vertical cavity surface emitting laser device comprising the steps of:
    providing a wafer structure including a substrate having a surface, a first stack of distributed Bragg reflectors disposed on a surface of the substrate, an active region disposed on the surface of the first stack of distributed Bragg reflectors, the active region including a plurality of quantum well layers and a plurality of uniformly doped barrier layers for shortening of carrier lifetime and the elimination of lateral carrier diffusion, and a second stack of distributed Bragg reflectors disposed on the surface of the active region; and forming a first and a second electrical contact in electrical cooperation with the active region.

23. A method of fabricating a vertical cavity surface emitting laser device as claimed in claim 22 wherein the laser is configured for high speed single mode operation of greater than 1 gigabit/sec.

24. A method of fabricating a vertical cavity surface emitting laser device as claimed in claim 22 wherein the plurality of doped barrier layers include a p-type dopant.

25. A method of fabricating a vertical cavity surface emitting laser device as claimed in claim 24 wherein the p-type dopant includes one of carbon (C) and zinc (Zn).

26. A method of fabricating a vertical cavity surface emitting laser device as claimed in claim 22 wherein the plurality of doped barrier layers include a n-type dopant.

27. A method of fabricating a vertical cavity surface emitting laser device as claimed in claim 26 wherein the n-type dopant includes silicon (Si) and selenium (Se).

* * * * *